(12) United States Patent
Hwang

(10) Patent No.: US 9,112,509 B2
(45) Date of Patent: Aug. 18, 2015

(54) PHASE SYNCHRONIZATION CIRCUIT FOR AC VOLTAGE

(75) Inventor: Kyu Min Hwang, Gwangju (KR)

(73) Assignee: GREEN POWERSET CO., LTD., Seoul (KR)

( * ) Notice: Subject to any disclaimer, the term of this patent is extended or adjusted under 35 U.S.C. 154(b) by 371 days.

(21) Appl. No.: 13/535,672

(22) Filed: Jun. 28, 2012

(65) Prior Publication Data

US 2013/0234764 A1    Sep. 12, 2013

(30) Foreign Application Priority Data

Jun. 29, 2011 (KR) .......................... 10-2011-0063671
Aug. 26, 2011 (KR) .......................... 10-2011-0086002

(51) Int. Cl.
- *H02J 9/00* (2006.01)
- *H03L 7/00* (2006.01)
- *H02J 3/40* (2006.01)
- *H02M 1/00* (2007.01)

(52) U.S. Cl.
CPC ... *H03L 7/00* (2013.01); *H02J 3/40* (2013.01); *H02M 2001/0009* (2013.01); *Y02E 10/563* (2013.01)

(58) Field of Classification Search
CPC ............ H03L 7/00; H02J 3/40; Y02E 10/563
See application file for complete search history.

(56) References Cited

U.S. PATENT DOCUMENTS

| | | | |
|---|---|---|---|
| 6,429,546 B1* | 8/2002 | Ropp et al. ...................... | 307/31 |
| 2012/0091817 A1* | 4/2012 | Seymour et al. ................ | 307/82 |
| 2013/0069429 A1* | 3/2013 | Yang et al. ...................... | 307/23 |
| 2013/0113293 A1* | 5/2013 | Elpel ............................... | 307/82 |
| 2013/0119769 A1* | 5/2013 | Johnson et al. ................. | 307/68 |
| 2013/0181527 A1* | 7/2013 | Bhowmik ........................ | 307/63 |

* cited by examiner

Primary Examiner — Daniel Cavallari
(74) Attorney, Agent, or Firm — William Park & Associates Ltd.

(57) ABSTRACT

A phase synchronization circuit for AC voltage includes an optical phase detection unit that outputs a phase detection signal by detecting an externally provided first AC voltage; a power failure detection unit that outputs a power failure signal by detecting the power failure condition of the first AC voltage; a control unit that selectively activates a selection signal according to the control of the power failure detection signal and outputs a phase control signal according to the control of the phase detection signal; a second AC voltage generation unit that generates a second AC voltage to have the same phase of the first AC voltage when outputting a second AC voltage according to the control of the phase control signal; and a selection unit that outputs either the first AC voltage or the second AC voltage according to the control of the selection signal.

16 Claims, 5 Drawing Sheets

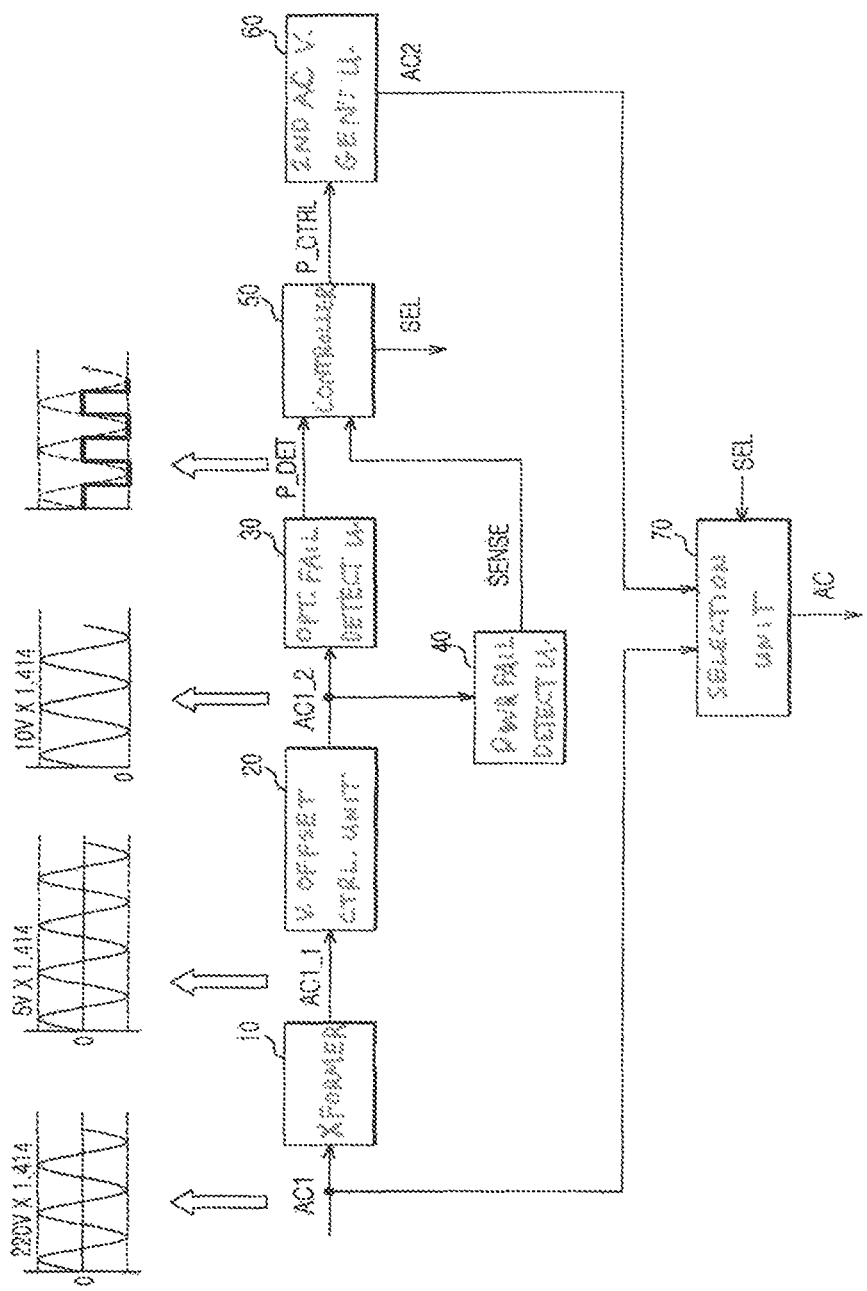

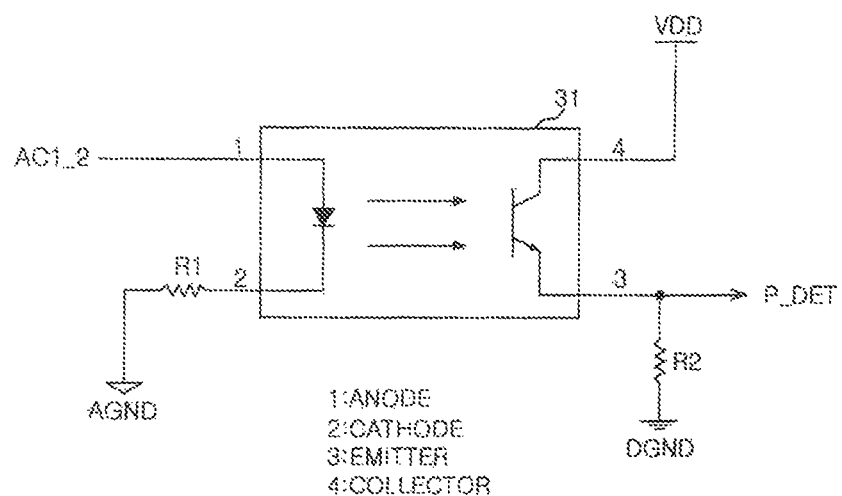
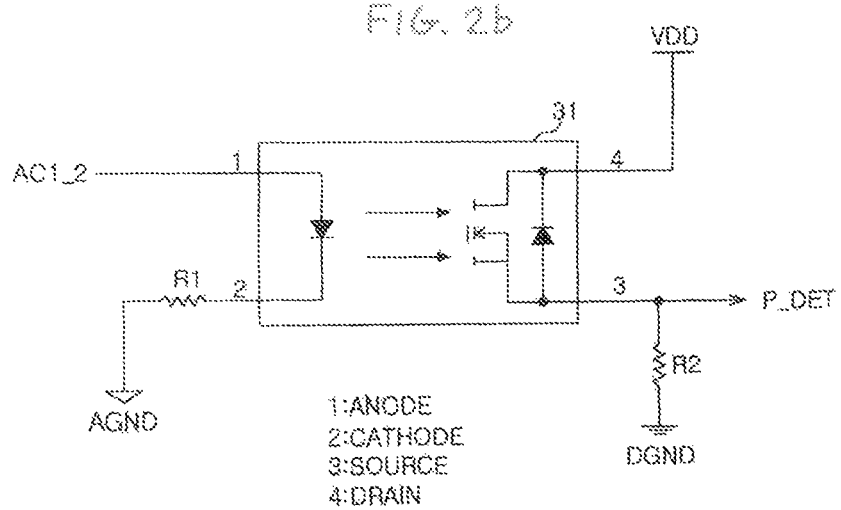

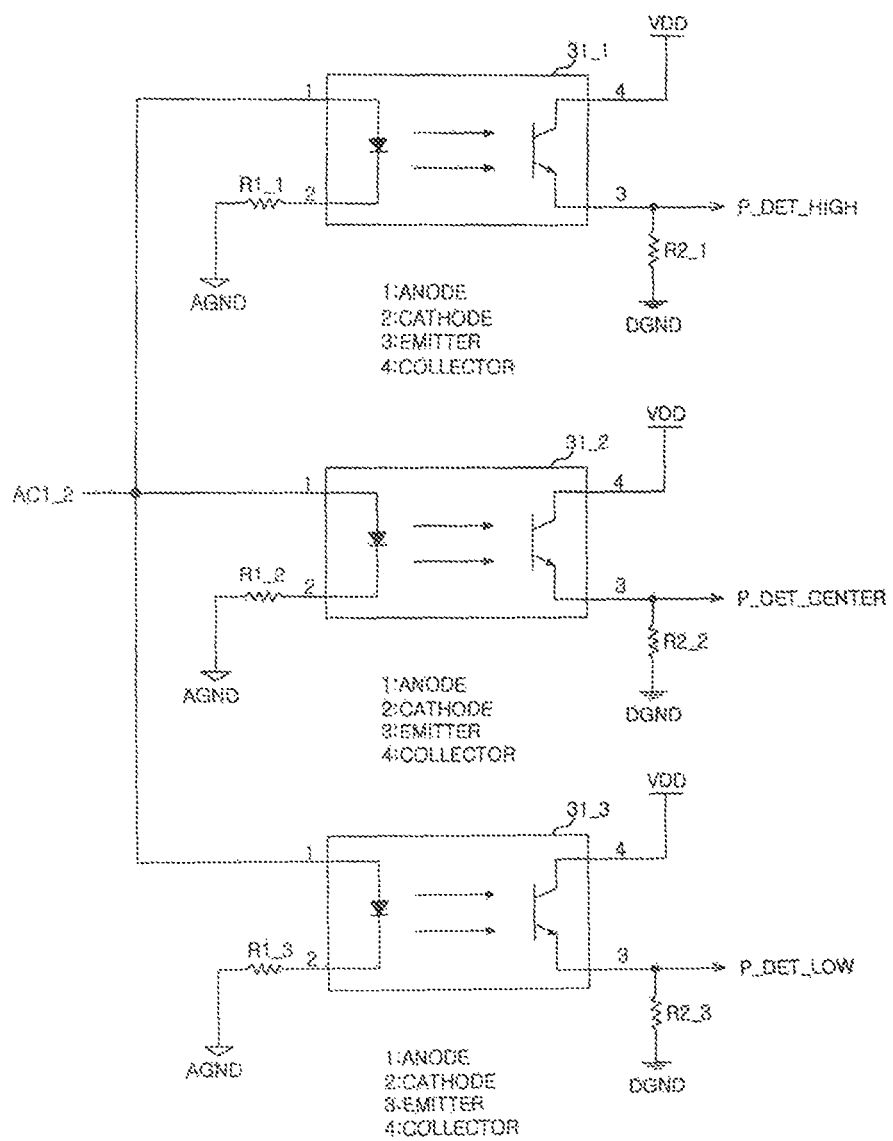

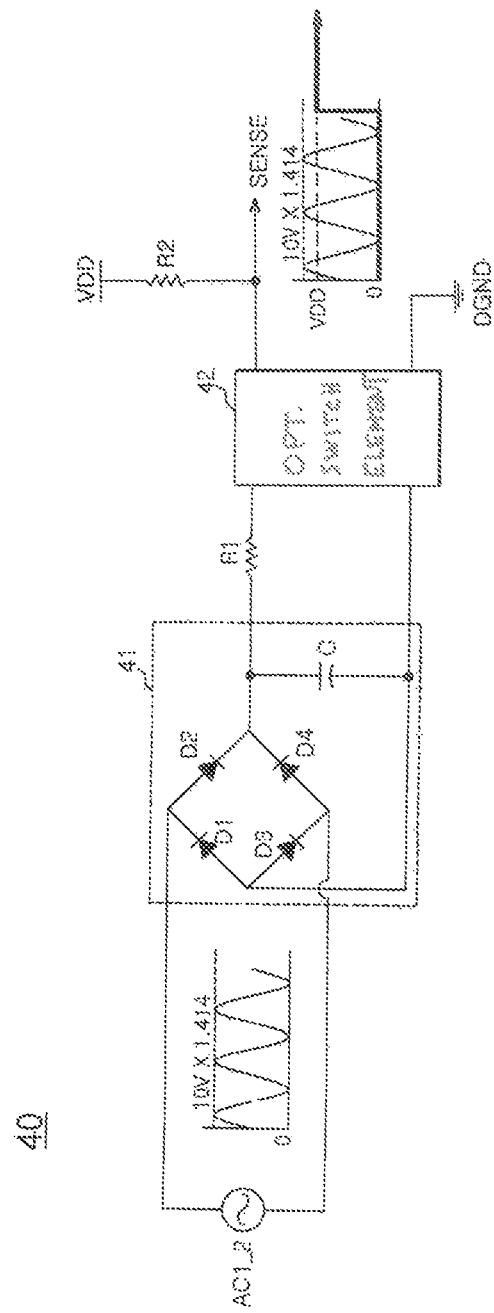

PHASE SYNCHRONIZATION CIRCUIT FOR AC VOLTAGE

CROSS-REFERENCE TO RELATED APPLICATION

This application claims priority from Korean Patent Application Nos. 10-2011-0063671 filed on Aug. 29, 2011 and 10-2011-0086002 filed on Aug. 26, 2011, the contents of which are incorporated herein by reference in entirety.

FIELD OF TECHNOLOGY

The present invention relates generally to apparatus for controlling electric power, and more particularly to synchronizing the phase of alternating current voltages.

BACKGROUND

External Power voltages are provided in sinusoidal waveforms to indoors of, for example, homes and factories. In places such as factories where the consequential loss due to power failure might be great, they may be equipped with uninterruptable power supply (UPS) in anticipation of unexpected power failures so that they can use the energy storage device instead when the power does not become available from the electric power grid. UPS can provide AC electricity in the event external electric power supply from the grid has failed, but supply of sinusoidal AC electricity that is not synchronized in phase can cause damages or fire to high precision equipment and instruments. Therefore, it needs to be known at what phase the AC power supply from the grid has failed in order to synchronize the phase of the replacement AC electricity. An UPS recreates the AC voltage magnitude and the phase, which correspond to those of the power from the grid at the time of the power failure, so that it can avoid damaging equipment.

In general, PID control sensors are used for AC voltage synchronization, or analog to digital converters (ADC) are used to perform the synchronization by converting the grid power electricity and predicting ahead.

A PID control sensor measures two values, passes through the controller based on the difference of the two values, and calculates the next responsive operation. A PID control sensor is highly complex, and resulting value of the PID control sensor is based on the measured value of the ADC, but since the error in the measured value of ADC cannot be ignored, PID has a shortfall of providing lower results for the cost of providing a PID.

OBJECTS TO SOLVE

The present invention provides an AC electricity phase synchronization circuit with lower complexity and cost and faster responsiveness to power failure.

SUMMARY OF THE INVENTION

According to an embodiment of the present invention, a phase synchronization circuit for AC voltage includes: a transformer that generates a first internal voltage by relatively lowering scale of the externally provided a first AC voltage; an voltage offset control unit that removes the negative voltage portion by adjusting the offset of the first internal voltage, removes the external noise by at least two RC filtering, and generates a second internal voltage by lowering the scale of the first internal voltage; an optical phase detection unit for outputting a phase detection signal by detecting the phase of the second internal voltage; a power failure detection circuit that detects the power failure condition of the first AC voltage and outputs the power failure detection signal; a control unit that compensates the phase of the second AC voltage, and generates a output control signal for selecting the second AC voltage as an output instead of the first AC voltage from the power detection failure signal received from the power failure detection unit; a second AC voltage generation unit that compensates and generates a second AC voltage in response to the command from the controller unit; a selection unit that outputs a first AC voltage or a second AC voltage according to the output control signal from the controller unit.

According an embodiment of the present invention, a phase synchronization circuit for AC voltage includes: an optical phase detection unit, when determining the phase of a first AC voltage provided externally, detecting different phases and outputting a plurality of the phase detection signal; a power failure detection unit that detects the power failure condition of the first AC voltage and outputs a power failure detection signal; a control unit that selectively activates a selection signal according to the control of the power failure detection signal and outputs a phase control signal according to the control of the plurality of the phase detection signals; a second AC voltage generation unit, when outputting a second AC voltage by controlling the phase according to the phase control signal, generating a second AC voltage so that the phase is same as the phase of the first AC voltage; and a selection unit that outputs one of the first AC voltage and the second AC voltage according to the control of the selection signal.

EFFECTS OF THE PRESENT INVENTION

According to the present invention, circuit complexity is lowered by reducing the components that make up the AC electricity phase synchronization circuit. Further, it will lessen the burden on the micro controller unit (MCU) by lessening the number of computations it needs to perform. Further, it can prevent any possible shorts from occurring between the external AC electricity and the internal DC electricity provided for operating the MCU by utilizing optical switching device to input the phase detection signal from the MCU.

BRIEF DESCRIPTION OF THE DRAWINGS

FIG. 1 shows the phase synchronization circuit for ac voltage according to an embodiment of the present invention.

FIG. 2a shows the optical phase detection unit of FIG. 1 according to a first embodiment of the present invention FIG. 2b shows the optical phase detection unit of FIG. 1 according a second embodiment of the present invention.

FIG. 2c shows a optical phase detection unit of FIG. 1 according to a third embodiment of the present invention.

FIG. 3a shows the power failure detection unit according to a first embodiment of the present invention.

DETAILED DESCRIPTION OF EMBODIMENTS

Figure 3B:
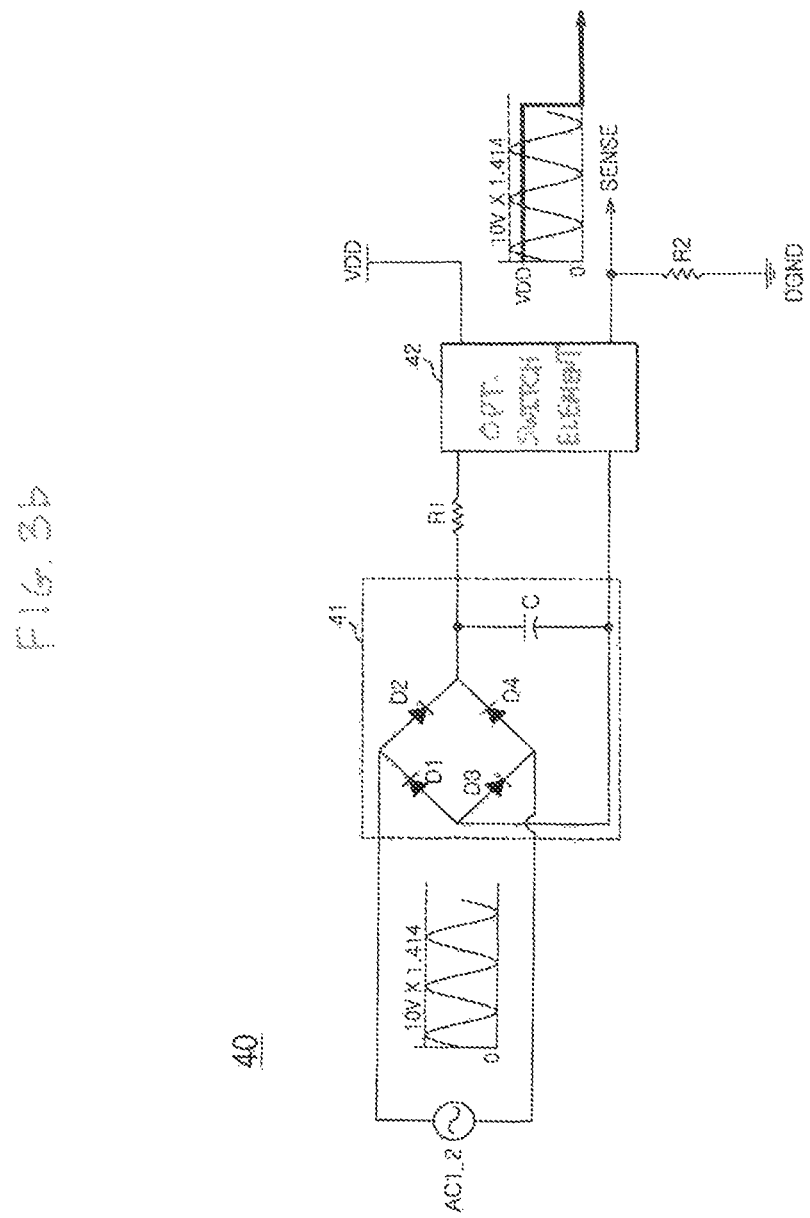
FIG. 3b shows the power failure detection unit according a second embodiment of the present invention.

In order for those of the ordinary of skilled in the art to understand the technical nature of the present invention, various embodiments of the present invention is described with respect to the associated drawings.

FIG. 1 shows AC voltage phase synchronization circuit according to an embodiment of the present invention.

Referring to FIG. 1, the AC voltage phase synchronization circuit comprises a transformer 10, a voltage offset control unit 20, optical phase detection unit 30, a control unit 50, a second AC voltage generation unit 60, and a selection unit 70.

The structure and the operations of the AC voltage phase synchronization circuit as above are as follows.

The transformer 10 receives a first AC voltage AC1 externally provided and generates a first internal voltage AC1_1, which is reduced in scale when compared to the first AC voltage AC1. The scale of the voltage levels of the first AC voltage AC1 and the first internal voltage AC1_1 can vary depending on various embodiments.

The voltage offset control unit 20 controls the offset of the first internal voltage AC1_1 by offsetting the voltage on or above the 0 V so as to eliminate the negative voltage component; and removes the noise of the first internal voltage AC1_1 by passing through RC filters twice; and reduces the scale of the first internal voltage AC1_1 and outputs it as the second internal voltage AC1_2. The voltage offset control unit 20 can be comprised of a plurality of non-inverting amplifiers and performs the operations to adjust the offset and scale of the second internal voltage AC1_2 and eliminate noise.

The power failure detection unit 40 detects the cut off condition of the second internal voltage AC1_2, that is the power failure condition, and outputs the power failure detection signal SENSE. That is, the power failure detection part 40 detections the power failure contition of the first AC voltage AC1 through the second internal voltage AC1_2, and outputs the detection results as the power failure detection signal SENSE.

The optical phase detection unit 30 detections the phase of the second internal voltage AC1_2 and outputs the phase detection signal P_DET. The optical phase detection unit 30 may comprise optical switching elements and a resistance unit (R1 in FIG. 2a) for determining the size of the phase to be detected. By using optical switching elements, the current flow between two voltages having different ground levels can be prevented to protect the internal parts. That is, since the optical switching elements optically communicates between the input and output parts, no current flows between the input and output parts. Thus, the internal parts can be protected through optical insulation.

The controller 50 selectively activates the selection signal SEL under the control of the power failure detection signal SENSE and outputs the phase control signal P_CTRL according to the control of the phase detection signal P_DET. The control may comprise a microcontroller.

The second AC voltage generation unit 60 compensates the phase of the second AC voltage AC2 under the control of the phase control signal P_CTRL. The second AC voltage generation unit 60 generates the second AC voltage AC2 having the same phase as the first AC voltage AC1. For example, the second AC voltage generation unit 60 may comprise a device that converts a DC voltage stored in a battery into an AC voltage.

The selection unit 70 outputs one of the first AC voltage and the second AC voltage according to the control of the selection signal SEL. The selection unit 70 outputs the first AC voltage AC1 externally provided when there is no power failure as the output AC voltage AC, but the selection unit 70 outputs the second AC voltage AC2 internally generated as the output AC voltage AC. The phase of the second AC voltage AC2 should be identical to the phase of the first AC voltage AC1, and this secures the safety and reliability of the operations of the device using the output AC voltage AC.

FIG. 2a shows the optical phase detection unit of FIG. 1 according to a first embodiment of the present invention, and FIG. 2b shows the optical phase detection unit of FIG. 1 according a second embodiment of the present invention.

Referring to FIG. 1 and FIG. 2, the optical phase detection unit 30 comprises: optical switching element 31 for performing the optical isolation; a resistance R1 for determining the size of the phase; and a pull down resistance R2 for provide an output by quickly responding to the detected phase signal. The second internal voltage AC1_2 is received through the first input part 1 of the optical switching element 31, and the first resistance R1 is connected between the second input part 2 of the optical switching element 31 and the ground AGND of the second input part 2. The external voltage VDD is applied to the first output part 4 of the optical switching element 31, and the second resistance is connected between the second output part 3 of the optical switching element 31 and the ground DGND of the second output part 3. The optical switching element 31 of FIG. 2a may be comprised of a photo coupler, and the optical switching element 31 of FIG. 2b may be comprised of a photo MOS; however, it should be readily recognized that other various types of similar optical switching elements can also be used.

When the second internal voltage AC1_2 is above a predetermined voltage level, the first output part 4 and the second output part 3 of the optical switching element are electrically connected, and the phase detection signal P_DET is outputted at the second output part 3 of the optical switching element 31. When the current between the first and second input parts 1, 2 due to the second internal voltage AC1_2 and the first resistance R1 is above a predetermined level, the first and second output parts 4, 3 are electrically connected such that the phase detection signal P_DET become a high level. Since the phase detection signal P_DET becomes high level when the second internal voltage AC1_2 has reached a certain predetermined level, the particular phase of the second internal voltage AC1_2 can be detected.

For example, a pull-down resistance (R2 of FIG. 2) was used in an embodiment of the present of the present invention, but it is also possible to design such that a pull up resistance connected between the external voltage VDD and the first output part 4 can be used, and when the current between the first and second input parts is above a predetermined level, the phase detection signal P_DET can be outputted as a low level. In such a case, the phase detection signal P_DET can be outputted from the first output part 4.

By adjusting the resistance value of the first resistance R1, the current between the first and second input parts 1, 2 can be controlled, and thus it is possible to control the time at which the phase detection signal P_DET become high level.

FIG. 2c shows a optical phase detection unit of FIG. 1 according to a third embodiment of the present invention. The optical phase detection unit of FIG. 2c utilizes a plurality of switching elements 31_1, 31_2, 31_3 and the first resistances R1_1, R1_2, R1_3, each of which having different resistance value, and generates a plurality of phase detection signals P_DET_HIGH, P_DET_CENTER, P_DET_LOW. The phase detection unit can detect the different phases of the second internal voltage AC1_2 and output a plurality of phase detection signals P_DET_HIGH, P_DET_CENTER, P_DET_LOW and provide them to the control unit 50.

This allows the second AC voltage generation unit 60 to have more precise control of synchronizing the second AC voltage AC2 with the phase of the first AC voltage AC1.

FIG. 3a shows the power failure detection unit according to a first embodiment of the present invention, and FIG. 3b shows the power failure detection unit according a second embodiment of the present invention.

Referring to FIGS. 3a-3b, the power failure detection part 40 comprises a rectifier 41 that receives the second internal voltage AC1_2 and generates an AC voltage and an optical switching element 42 that detects whether the AC voltage is above a predetermined level and outputs a power failure detection signal SENSE.

According to an embodiment of the present invention, the rectifier 41 comprises a plurality of diodes D1, D2, D3, D4 that form a bridge rectifier circuit and a capacitor C1 that stores the signal outputted from the plurality of diodes D1, D2, D3, D4 and outputs a AC voltage.

In FIG. 3a, when there is no power failure, voltage level of the power failure detection signal SENSE that is outputted from the output terminal of the optical switching element 42 is a low level, since the capacitor C1 is charged with a certain level of AC voltage. However, when there is a power failure, the voltage level of the power failure detection signal SENSE that is outputted at the output terminal of the optical switching element 42 is a high level as the AC voltage stored in the capacitor C1 is discharged.

On the other hand, in FIG. 3b, when there is no power failure, the voltage level of the power failure detection signal SENSE that is outputted from the output terminal of the optical switching element 42 is a high level, since a certain level of AV voltage is charged in the capacitor Cl. However, when there is a power failure, the level of the power failure detection signal SENSE that is outputted by the output terminal of the optical switching element 42 is a low level since the AC voltage stored in the capacitor C1 is discharged.

That is, FIG. 3a is directed to an embodiment that outputs a power failure detection signal SENSE utilizing a pull-up resistance, and FIG. 3b is directed to an embodiment that outputs a power failure detection signal SENSE utilizing a pull-down resistance.

According to an embodiment of the present invention, the circuit for the phase synchronization circuit for AC voltage can be made less complex by utilizing less number of circuit elements, and thereby lowering the cost of the circuit. Further, microcontroller unit (MCU) will be less burdensome by

What is claimed is:

1. A phase synchronization circuit for AC voltage comprising:
   an optical phase detection unit that outputs a phase detection signal by detecting an externally provided first AC voltage;
   a power failure detection unit that outputs a power failure signal by detecting the power failure condition of the first AC voltage;
   a control unit that selectively activates a selection signal according to the control of the power failure detection signal and outputs a phase control signal according to the control of the phase detection signal;
   a second AC voltage generation unit that generates a second AC voltage to have the same phase of the first AC voltage when outputting a second AC voltage according to the control of the phase control signal; and
   a selection unit that outputs either the first AC voltage or the second AC voltage according to the control of the selection signal.

2. A phase synchronization circuit for AC voltage of claim 1 further comprising:
   a rectifier that receives a first AC voltage and generates a first internal voltage; and
   a voltage offset control unit that controls the offset of the first interval voltage, readjusts the scale, and outputs as a second internal voltage to the optical phase detection unit and the power failure detection unit.

3. A phase synchronization circuit for AC voltage of claim 2, wherein the voltage offset control unit is comprised of non-inverting amplifiers to control the offset and scale of the second internal voltage and to remove noise utilizing an RC filter.

4. A phase synchronization circuit for AC voltage of claim 2, wherein the optical phase detection unit comprises:
   an optical switching element receiving a second internal voltage through a first input terminal and comprising:
      a first resistive unit connected between a second input terminal and a ground voltage terminal of the second input terminal; and
      a second resistive unit connected between a second terminal and the ground terminal of the second terminal,
   wherein the first output terminal and the second output terminal are electrically connected when the second internal voltage level is above a predetermined voltage level so as to output the phase detection signal through the second terminal.

5. A phase synchronization circuit for AC voltage of claim 4, wherein the optical switching element is comprised of a photo coupler.

6. A phase synchronization circuit for AC voltage of claim 4, wherein the optical switching element is comprised of a photo MOS.

7. A phase synchronization circuit for AC voltage of claim 2, wherein the power failure detection unit comprises
   a rectifier receiving the second internal voltage and generating an AC voltage; and
   an optical switching element detecting whether the AC voltage is above a predetermined level and outputting a power failure detection signal.

8. A phase synchronization circuit for AC voltage of claim 7, wherein the rectifier comprises:
   a plurality of diodes forming a bridge rectifier circuit; and
   a capacitor storing the output signals from the plurality of the diodes and outputs a DC voltage.

9. A phase synchronization circuit for AC voltage of claim 1 further comprising:
   an optical phase detection unit, when determining the phase of the first AC voltage provided externally, detecting different phases and outputs a plurality of phase detection signals;
   a power failure detection unit detecting the power failure condition of the first AC voltage and outputting a power failure detection signal;
   a control unit selectively activating a selection signal according to the control of the power failure detection signal and outputting a phase control signal;
   a second AC voltage generation unit, when outputting a second AC voltage by controlling the phase according to the control of the phase control signal, generating a second AC voltage having the substantially same phase as the first AC voltage; and
   a selection unit that outputs one of the first AC voltage or the second voltage according to the control of the selection signal.

10. A phase synchronization circuit for AC voltage of claim 9, further comprising:
   a transformer receiving the first AC voltage and generating a first internal voltage; and
   a voltage offset control unit controlling the offset of the first internal voltage, rescaling the first internal voltage, and outputting a second internal voltage to the optical phase detection unit and the power failure detection unit.

11. A phase synchronization circuit for AC voltage of claim 10, wherein the voltage offset control unit is comprised of a plurality of non-inverting amplifiers, controls the offset and scale of the second internal voltage, and removes the noise utilizing a RC filter.

12. A phase synchronization circuit for AC voltage of claim 10,
wherein the optical phase detection unit is comprised of a plurality of optical switching elements, and
wherein each optical switching element receives the second internal voltage through a first input terminal, has a first resistive unit connected between a second input terminal and the ground terminal of the second input terminal, receives a power supply voltage through the first input terminal and has a second resistive unit connected between the second terminal and the ground terminal of the second terminal, and
wherein the resistive value of the first resistive unit in each of the plurality of the optical switching elements is different from each other.

13. A phase synchronization circuit for AC voltage of claim 12, wherein the optical switching element is comprised of a photo coupler.

14. A phase synchronization circuit for AC voltage of claim 12, wherein the optical switching element is comprised of a photo MOS.

15. A phase synchronization circuit for AC voltage of claim 10, wherein the power failure detection unit is comprised of:
a rectifier receiving the second internal voltage and generating a DC voltage; and
an optical switching element detecting whether the DC voltage is above a predetermined level and outputting a power failure detection signal.

16. A phase synchronization circuit for AC voltage of claim 15, wherein the rectifier is comprised of:
a plurality of diodes forming a bridge rectifier circuit; and
a capacitor storing a signal outputted from the plurality of the diodes and outputs an AC voltage.

* * * * *